United States Patent [19]
Weiner

[11] Patent Number: 5,821,674
[45] Date of Patent: Oct. 13, 1998

[54] RECTIFIER DEVICE WITH HEAT SINK AND OUTPUT CONNECTORS ADAPTED FOR HARD-WIRE CONNECTION

[76] Inventor: Al Weiner, 8860 SW. 105th St., Miami, Fla. 33176

[21] Appl. No.: 452,580

[22] Filed: May 25, 1995

Related U.S. Application Data

[63] Continuation-in-part of Ser. No. 407,710, Mar. 21, 1995, abandoned.

[51] Int. Cl.$^6$ ............... H02K 11/00; H02B 1/00
[52] U.S. Cl. ............... 310/68 D; 310/71; 310/89; 363/144; 363/145
[58] Field of Search ............... 310/68 D, 71, 310/43, 89, 91; 363/141, 145, 144, 146, 690, 714, 715, 722; 439/620, 893

[56] References Cited

U.S. PATENT DOCUMENTS

| | | | |
|---|---|---|---|
| 3,069,615 | 12/1962 | Jensen | 321/48 |
| 3,303,392 | 2/1967 | Zelina | 317/100 |
| 3,631,275 | 12/1971 | Conrad et al. | 310/71 |
| 3,831,047 | 8/1974 | Sokol et al. | 310/68 |
| 3,870,944 | 3/1975 | Ogawa et al. | 310/68 D |
| 3,979,659 | 9/1976 | Lynch, Jr. et al. | 321/8 R |
| 4,288,711 | 9/1981 | Hagenlocher et al. | 310/68 D |
| 4,321,664 | 3/1982 | Matthai | 310/68 D |
| 4,360,749 | 11/1982 | Neumann et al. | 310/42 |
| 4,459,499 | 7/1984 | Bonecker et al. | 310/68 R |
| 4,538,149 | 8/1985 | Smith et al. | 310/68 D |
| 4,606,000 | 8/1986 | Steele et al. | 310/68 D |
| 4,701,828 | 10/1987 | Weiner | 310/68 D |
| 4,835,427 | 5/1989 | Bohm et al. | 310/68 D |
| 4,843,267 | 6/1989 | Kaneyuki | 310/68 D |
| 5,001,376 | 3/1991 | Iseman | 310/68 D |
| 5,012,145 | 4/1991 | Frantz et al. | 310/68 D |
| 5,027,255 | 6/1991 | Zeitlin et al. | 361/395 |
| 5,043,614 | 8/1991 | Yockey | 310/68 D |
| 5,166,564 | 11/1992 | Shahamat et al. | 310/68 D |
| 5,172,310 | 12/1992 | Deam | 363/144 |
| 5,233,246 | 8/1993 | Yockey | 310/71 |
| 5,258,673 | 11/1993 | Goton | 310/68 D |
| 5,289,363 | 2/1994 | Ferchau et al. | 363/141 |
| 5,350,959 | 9/1994 | Flaminio et al. | 310/71 |

*Primary Examiner*—Steven L. Stephan
*Assistant Examiner*—Michael J. Wallace, JR.
*Attorney, Agent, or Firm*—Shlesinger Arkwright & Garvey LLP

[57] ABSTRACT

A rectifier device comprises a heat conductive housing including a plurality of cooling fins; a plurality of diodes disposed within the housing and thermally connected thereto such that heat generated by the diodes during operation is transferred to the housing; input connector operably connected to the diodes; and output connector one end of which is operably connected to the diodes and the other end of which is adapted for hard-wire connection to a load.

26 Claims, 7 Drawing Sheets

RECTIFIER DEVICE WITH HEAT SINK AND OUTPUT CONNECTORS ADAPTED FOR HARD-WIRE CONNECTION

RELATED PATENT APPLICATION

This application is a continuation-in-part of application of Ser. No. 08/407,710, filed Mar. 21, 1995, now abandoned.

FIELD OF THE INVENTION

The present invention relates generally to electronic equipment and particularly to a rectifier device with heat sink hard-wired output conductors for use in an alternator of a motor vehicle.

BACKGROUND OF THE INVENTION

Figure 1A:
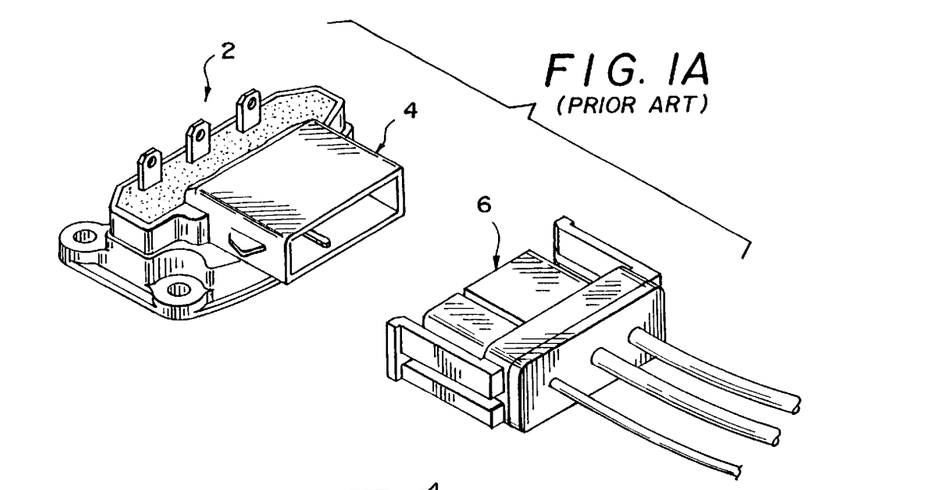
FIG. 1A is a perspective view of a prior art rectifier bridge assembly, including a plug-in wiring harness.
Figure 1B:
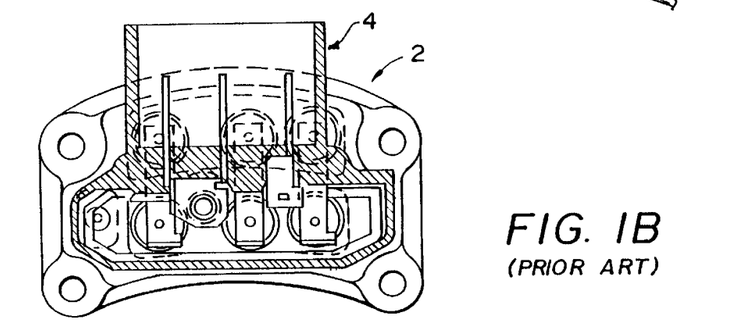
FIG. 1B is a top plan view of the prior art device in FIG. 1A, with portions shown in cross section.
Figure 1C:
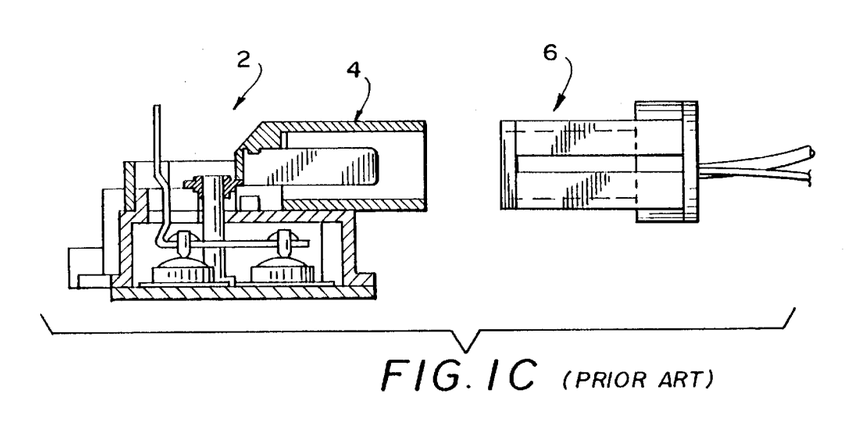
FIG. 1C is a side elevational view of FIG. 1A with portions shown in cross section.

The prior art rectifier bridge assembly 2 currently used in an alternator of a motor vehicle, such as FORD FG-2 IAR alternator, is disclosed in FIG. 1. The rectifier assembly 2 has a plastic female plug 4 that receives a cooperating male plug-in harness 6 which connects the rectifier assembly 2 to a battery (not shown). The prior art rectifier assembly 2 has experienced relatively high failure rate due to excessive heat build-up during use. It was found that prolonged arcing occurs between the female plug 4 and the male plug-in harness 6, causing overheating and premature failure of the diodes within the assembly. overheating may also be attributed to the inadequate heat radiating capability of the housing of the assembly 2, which is made of relatively thin and low mass material. Since the assembly 2 is typically installed within the enclosure of the alternator, which is then disposed in the engine compartment of the vehicle, the assembly 2 is subjected to relatively high temperature, contributing to the overheating problem for the assembly.

There is therefore a need for a rectifier assembly that obviates the problems associated with the prior art device.

OBJECTS AND SUMMARY OF THE INVENTION

It is a object of the present invention to provide a rectifier device that uses hard-wired conductors to eliminate the use of a plug-in connection to the wiring harness, thus eliminating arcing and overheating at the connector that is typical of the prior art device.

It is another object of the present invention to provide a rectifier device that provides hard-wiring capability for its output conductors and yet provides relatively easy means for disconnecting the output conductors without the arcing and overheating problem of the prior art device.

It is still another object of the present invention to provide a rectifier device that provides a hard-wired connector with thermal expansion capability to absorb the thermal stress generated at the connection point within the rectifier device during use.

It is another object of the present invention to provide a rectifier device with a relatively high mass and finned aluminum body for absorbing heat from the heat generating components within and radiating heat away from the device.

It is still another object of the present invention to provide a rectifier device that operates at relatively lower temperature, thereby permitting the diodes to function more efficiently and reduce the probability of premature failure.

It is yet another object of the present invention to provide a rectifier device that provides a robust aluminum housing for increased long term reliability and reduced possibility of damage during installation.

It is another object of the present invention to provide a rectifier device with a finned housing structure that is oriented within the alternator enclosure to take advantage of the cooling airflow within the enclosure.

In summary, the present invention provides a rectifier device comprising a heat conductive housing including a plurality of cooling fins; a plurality of diodes disposed within the housing and thermally connected thereto such that heat generated by the diodes during operation is transferred to the housing; a plurality of input connectors operably connected to the diodes; and output connectors or conductors hard-wired to the diodes.

These and other objects of the present invention will become apparent from the following detailed description.

DETAILED DESCRIPTION OF THE INVENTION

Figure 2:
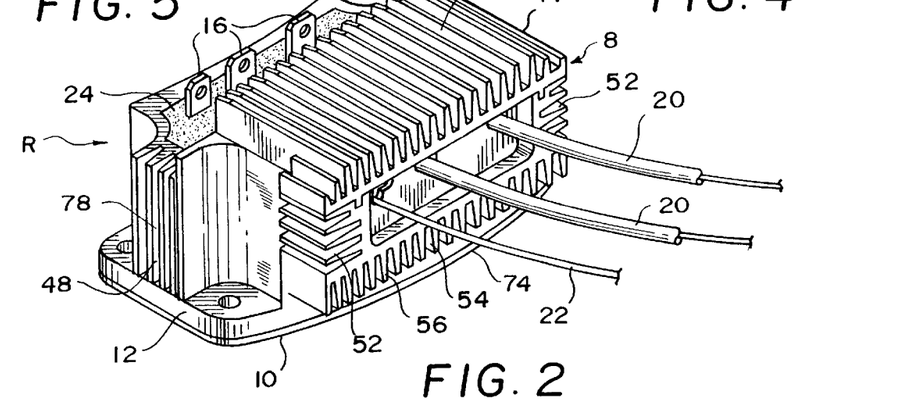
FIG. 2 is a perspective view of a rectifier device made in accordance with the present invention.

A rectifier device R made in accordance with the present invention is disclosed in FIG. 2. The device R has a housing 8 comprising a base plate 10, preferably made of copper, a cast body 12, preferably made of aluminum, and a cast cap 14, preferably made of aluminum. The housing 8 advantageously has relatively high mass, providing an effective heat sink and radiator for the heat generated by the diodes that make up the rectifier circuit within the housing 8. Bayonet connectors or terminals 16 are provided for connecting the device R to the output of an alternator (not shown). Insulated wires 20 are provided for connecting the device R directly to a wire harness (not shown) that is in turn connected to the positive terminal of a battery (not shown) of the vehicle in which the alternator is used. Sensor wire 22 is provided for connecting to a voltage regulator that regulates the voltage output of the alternator.

An epoxy filler 24, comprising a first layer 23 of hard epoxy and a second layer 25 of soft epoxy, is disposed within the cavity or interior of the housing 8 to provide encapsulation of the diodes and electrical connections therein. The hard epoxy layer 23 is available from Mavidon Corporation, Palm City, Fla., Part No. 934-6170 A/B Semiconductor Encapsulant. The epoxy layer 23 advantageously has thermal conductivity of 2.4 BTU (in./hr.) (ft$^2$) (degree F.). The hard epoxy layer 23 advantageously secures the diodes and electrical connections in place against vibrations during use. The soft epoxy layer 25 is also available from Mavidon, Part No. 934-110 A/B Elastomeric Encapsulant. The soft epoxy layer 25 advantageously provides resiliency or flexibility to the terminals 16 and the conductors 20 and 22 where they project beyond the epoxy filler 24, thereby minimizing fatigue failure from constant movement, such as from vibrations when in use.

Figure 3:
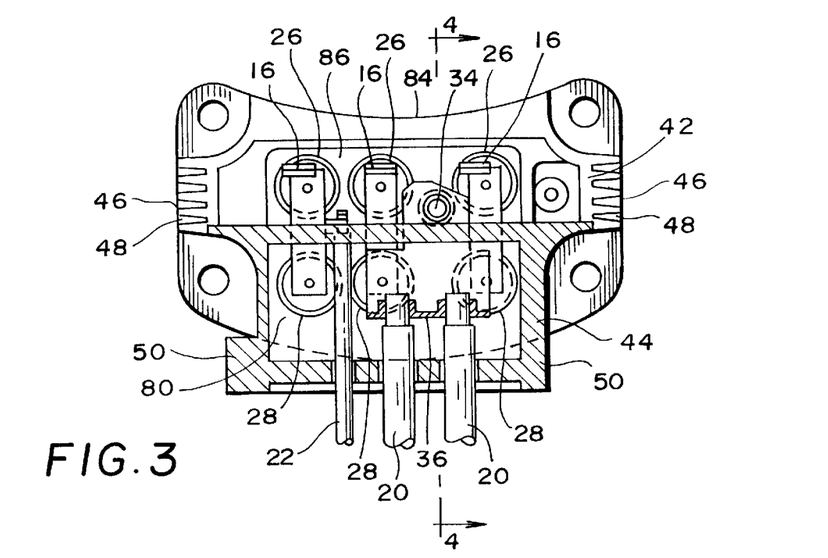
FIG. 3 is a top plan view of FIG. 2, with portions shown in cross section, with the epoxy filler deleted to show the interior details.
Figure 4:
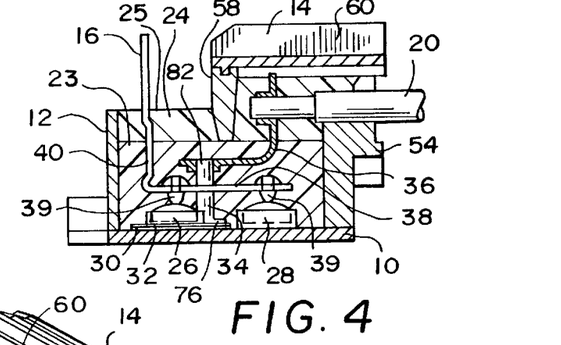
FIG. 4 is a cross sectional view taken along line 4—4 in FIG. 3.

Positive diodes 26 and negative diodes 28 are supported and secured to the base plate 10, as best shown in FIGS. 3 and 4. A ceramic layer 30 insulates the positive diodes 26 from the base plate 10. A thin layer 32 of conductive material such as copper deposited by a standard plasma process is disposed on top of the ceramic layer 30 to interconnect together the positive diodes 26. The ceramic layer 30 is attached to the base plate 10 by standard means. The ceramic layer 30 completely insulates the positive diodes 26 from the base plate 10, which is negatively ground through the vehicle grounding system. The positive diodes 26 are secured to the conductive layer 32 by standard means, such as soldering with tin silver alloy. The negative diodes are secured to the base plate 10 by standard means, such as soldering with tin silver alloy.

A connector post 34 has a bottom portion that is electrically secured to the conductive layer 32 and a top portion that rises above the diodes for connecting to the wires 20 by means of a L-shaped bus strip 36, as best shown in FIGS. 3 and 4.

The bus strip 36 advantageously provides a heat expansion means between the connector post 34 and the connecting ends of the wires 20. The connecting ends of the wires 20 are thereby relieved of stress due to thermal expansion and contraction, since the bus strip 36 absorbs much of the resulting expansion and contraction. Failure of the connection due to metal fatigue is minimized.

The diodes 26 and 28 are secured to the base plate 10 such that an excellent thermal connection is provided to efficiently conduct heat generated by the diodes to the base plate 10 and to the housing 8. The epoxy filler 24 also advantageously provides heat conduction from the diodes and the associated current carrying components, such as the connector post 34, terminals 16, bus strip 36, etc., to the housing 8.

Each of the terminals 16 has a horizontal portion 38 that is soldered to the terminals 39 of the respective positive and negative diodes 26 and 28, as best shown in FIGS. 3 and 4. Each of the terminals 16 has a vertical portion 40 that is offset to advantageously provide an anchor means that cooperates with the epoxy filler 24, thereby isolating any stress applied on the terminal 16 from the terminals 39 of the diodes 26 and 28.

The sensor wire 22 is electrically connected to one of the connector strips 16, as best shown in FIG. 3. The bus strip 36 is electrically connected to the connector post 34 and the wires 20 by standard means, such as pressure crimping, soldering with tin silver alloy, etc. The epoxy 24 completely encapsulates the ends of the wires 20, thereby advantageously providing support and stress relief to the connection ends of the wires 20, as best shown in FIG. 4. It will be understood that the wires 20 and 22 are hard-wired to the diodes 26, as opposed to using a plug-in connector, such that a relatively low resistance connection is obtained, eliminating the prolonged arcing and resultant heat build-up encountered with the plug-in connector of the prior art device 2.

The cast body 12 is hollow with open top and bottom. The bottom is completely closed off by the base plate 10 and the top partially by the cap 14, as best shown in FIG. 4. The base plate 10 is secured to the body 12 by standard means, such as by glue available from Waterford Specialty Adhesives, Inc., McKeesport, Pa., Part No. X-4239.

The body 12 has a wide portion 42 and a narrow portion 44, as best shown in FIG. 3. The wide portion 42 has opposite sides 46 with a plurality of cooling fins 48 with ridges and valleys that are disposed substantially transversely to the base plate 10. The narrow portion 44 has two opposite sides 50 with cooling fins 52 with ridges and valleys that are disposed substantially transversely to the cooling fins 48, as best shown in FIG. 2. The narrow portion 44 also includes a bottom wall 54 with a plurality of cooling fins 56, as best shown in FIGS. 2 and 4. The cooling fins 56 with ridges and valleys are disposed substantially transversely to the cooling fins 48. The cooling fins 48, 52 and 56 with respect to their respective ridges and valleys are disposed in a specific direction to take advantage of the airflow of the cooling air within the alternator enclosure for effective cooling of the device R during use.

The vertical walls of the narrow portion 44 are taller than the vertical walls of the wide portion 42 to advantageously allow vertical separation between the connecting ends of the wires 20 and 22 and the diodes 26 and 28, as best shown in FIGS. 2 and 4.

The cap 14 is disposed over the narrow portion 44 directly above the connecting ends of the wires 20 and 22, as best shown in FIG. 4. A wall 58 acts as a dam for the epoxy 24 in the narrow portion 44 of the housing 8, thereby permitting the narrow portion 44 to filled with the epoxy 24 to a higher level than the wide portion 42. The cap 14 has a plurality of cooling finns 60 with a plurality of ridges and valleys that are disposed substantially transversely to the cooling fins 48.

As can be seen in FIG. 4, the cooling fins 52 and 56 are advantageously disposed adjacent the diodes 28. Similarly, the cooling fins 48 are advantageously disposed adjacent the positive diodes 26. The short distances between the heat generating diodes and the cooling fins advantageously provide for relatively quick extraction of heat.

Figure 5:
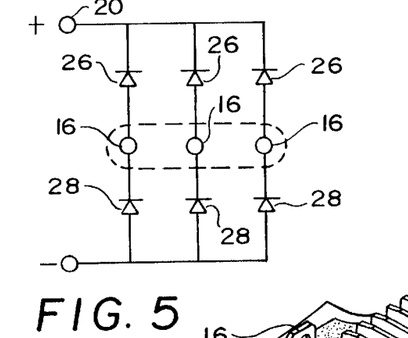
FIG. 5 is an electrical schematic diagram of the rectifier device of FIG. 2.

The electrical interconnection of the diodes 26 and 28 in the rectifier configuration is shown schematically in FIG. 5.

Figure 6:
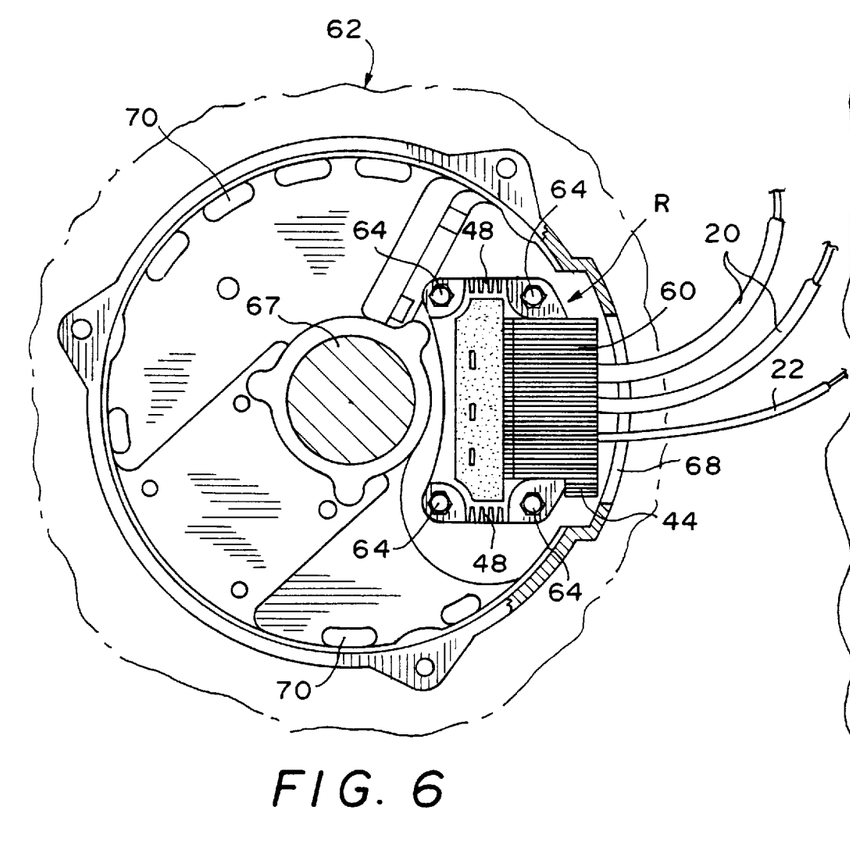
FIG. 6 is a fragmentary end view within an alternator, showing the location of the rectifier of the present invention as used in the alternator.
Figure 7:
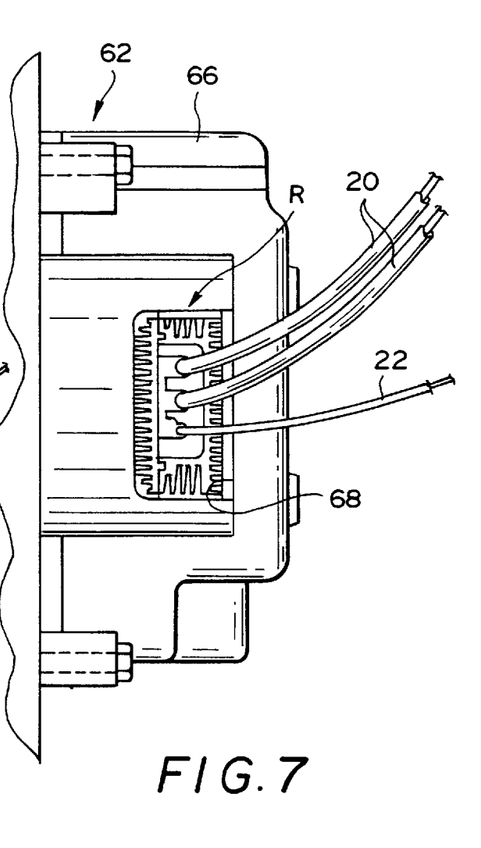
FIG. 7 is a fragmentary side elevational view of FIG. 6.

The device R is disposed within an alternator 62, which is typically used in a motor vehicle, as best shown in FIGS. 6 and 7. The device R is secured by standard means, such as bolts 64 in an and housing 66 of the alternator 62. The narrow portion 44 of the housing 8 is disposed adjacent an opening in the in housing 66, as best shown in FIGS. 6 and 7. The device R is disposed directly in the path of cooling air that is forced through the alternator by a fan (not shown) in a direction substantially parallel to the shaft 67 or axis of rotation of the alternator. The orientation of the cooling fins 48, 52, 56 and 60 are advantageously disposed in the direction of the cooling air for maximum mass flow through the ridges and valleys as the air exits through the opening 68 and other openings 70.

The device R was tested in comparison with the prior art rectifier bridge assembly 2. The results are shown in FIGS. 8A–10C. Recording thermocouples were installed in various locations in the prior art device and in the device R. Position 74 is on the base plate 10 near the negative diodes 28, as best shown FIG. 2. Position 76 is at the bottom of the connector post 34, as best shown in FIG. 4. Position 78 is on the cooling fins 48 near the positive diodes half way up between the top and bottom edges of the body 12, as best shown in FIG. 2. Position 80 is disposed on a negative diode 28, as best shown in FIG. 3. Position 82 is at the top of the connector post 34, as best shown in FIG. 4. Position 84 is on the base plate 10 near the positive diodes 26, as best shown in FIG. 3. Position 86 is on a positive diode, as best shown in FIG. 3. A standard alternator was hooked up to a drive motor and driven at 1500 rpm at 25 A output, 3200 rpm at 50 A, and 5500 rpm at 65 A.

Figure 8A:
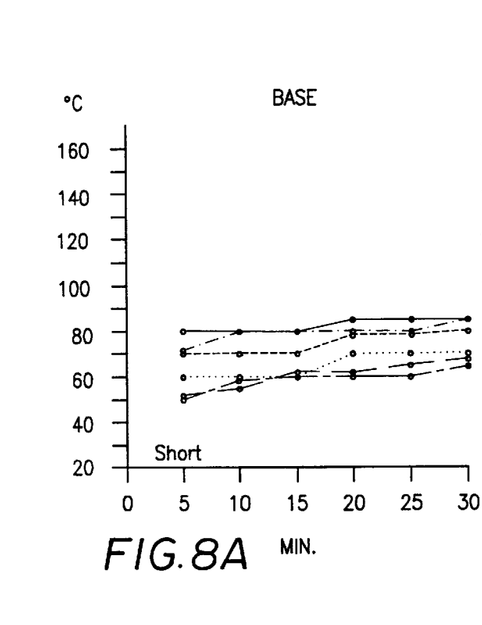
FIGS. 8A, 8B and 8C are graphs of operating temperatures over time of the prior art rectifier device and the rectifier device of the present invention, operated at 1500 rpm at 25 A output.
Figure 8B:
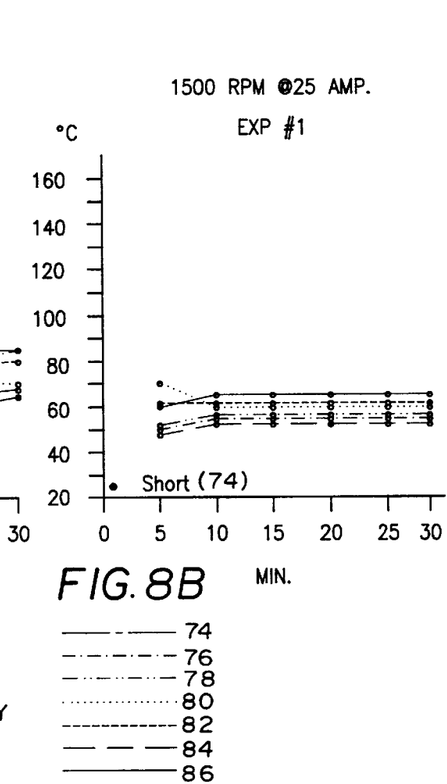
Figure 8C:
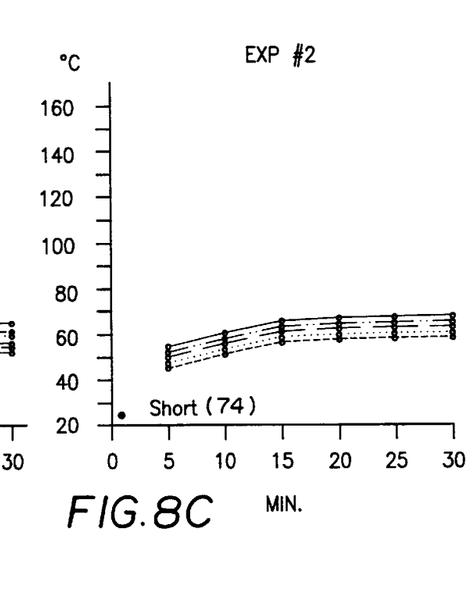
Figure 9A:
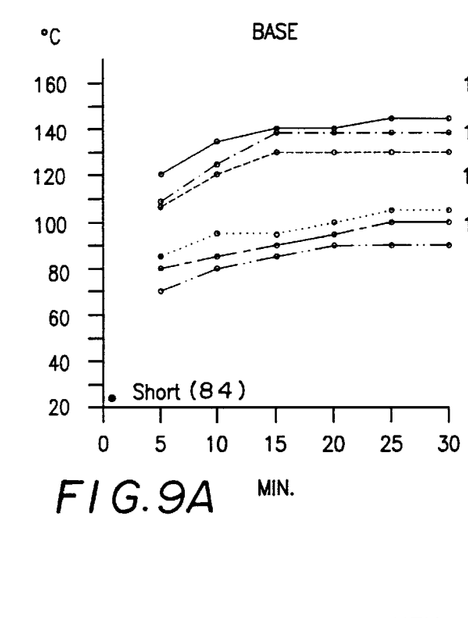
FIGS. 9A, 9B and 9C are graphs of operating temperatures over time of the prior art rectifier device and the rectifier device of the present invention, operated at 3200 rpm at 50 A output.
Figure 9B:
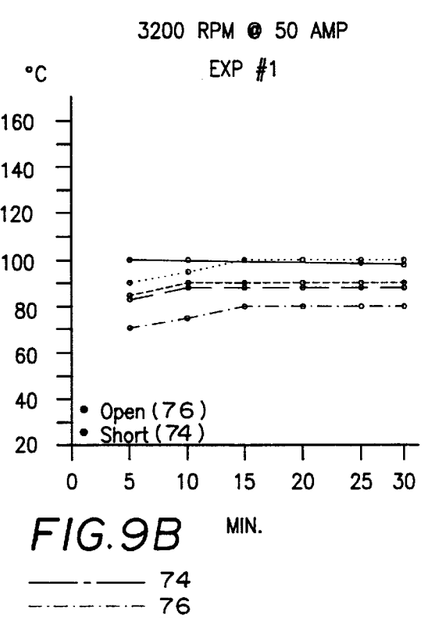
Figure 9C:
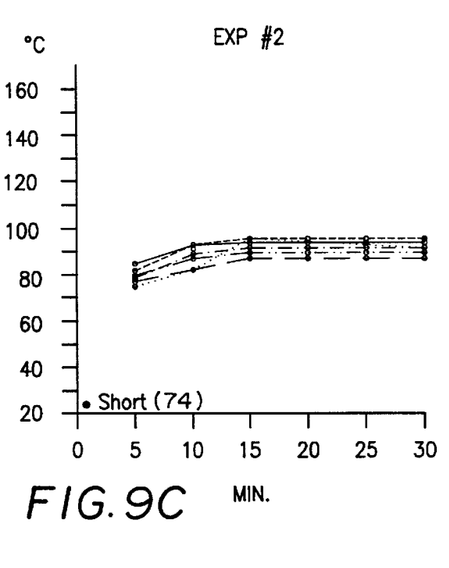
Figures 10A, 10B:
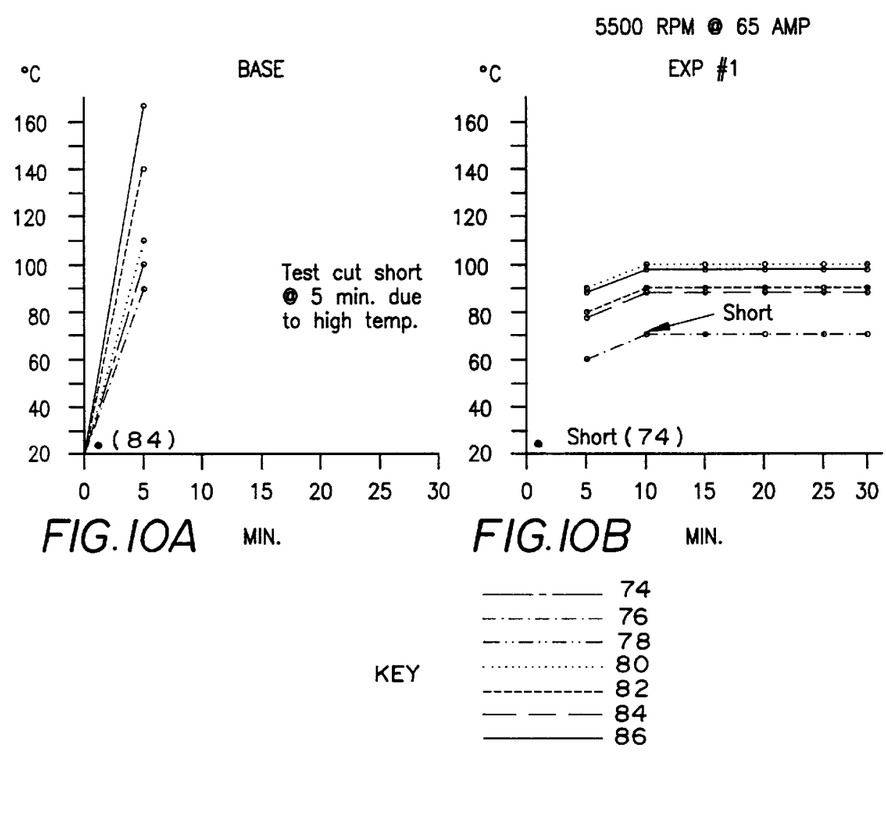
FIGS. 10A, 10B and 10C are graphs of operating temperatures over time of the prior art rectifier device and the rectifier device of the present invention, operated at 5500 rpm at 65 A output.
Figure 10C:
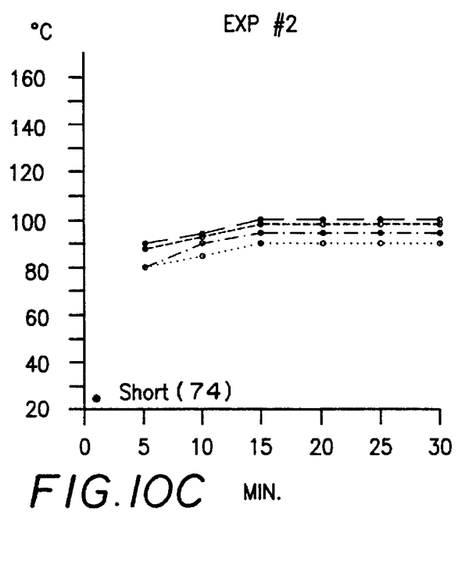

In the test setup, the prior art rectifier 2 was used with the alternator and the test results are shown in FIGS. 8A, 9A and 10A. The cooling fan of the alternator drew in ambient air. The device R is then used with the alternator under substantially the same conditions as the prior art device and the results are shown in FIGS. 8B, 9B and 10B. The alternator fan drew in ambient air. Hot air is then directed to the alternator to raise the temperature of the cooling air that was drawn in by the alternator cooling fan. The results are shown in FIGS. 8C, 9C and 10C.

It will be noted that the device R advantageously operated at even and lower temperatures as compared to the prior art device, thereby permitting the diodes 26 and 28 to operate at lower temperatures to minimize premature failure due to overheating.

Figure 11:
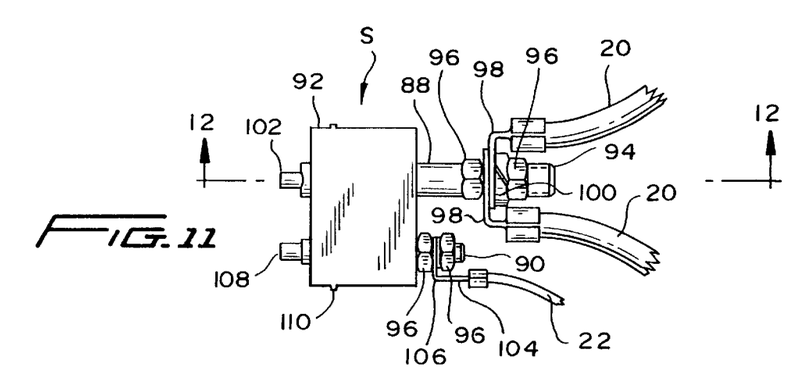
FIG. 11 is another embodiment of hard-wired output connector for the rectifier device of FIG. 2.

Another embodiment for hard-wiring the cables 20 to the diodes is a connector assembly S disclosed in FIG. 11. The assembly S includes a stud terminal 88 for the wires 20 and a smaller stud terminal 90 for the sensor wire 22. The stud terminals 88 and 90 are molded into a plastic block 92. The connector rod 88 has a threaded end 94 to which are screwed nuts 96 to secure cable clips 98 to the connector 88. A split washer 100 advantageously serves to lock the nuts 96 in place and provides clamping pressure to the clips 98. The opposite end of the connector rod 88 is adapted for connecting to the connector post 34 within the rectifier device R via the L-shaped connector strip 36, as best shown in FIG. 12.

The stud terminal 90 is used to removably secure a connector clip 104 for the sensor wire 22. The stud terminal 90 has a threaded portion for receiving the nuts 96. A split washer 106 advantageously keeps the nuts 96 securely in place. The stud terminal 90 has an end portion 108 for securing within the rectifier device R, similar to the connection shown in FIG. 12 for the connector stud 88.

The plastic block 92 has a flange portion 110 for advantageously providing a stop against lateral movement when installed within the housing 8. Each of the stud terminals 88 and 90 includes an annular flange 112 that cooperates with the plastic block 92, thereby to keep the block 92 secured to the stud terminals 88 and 90.

Figure 12:
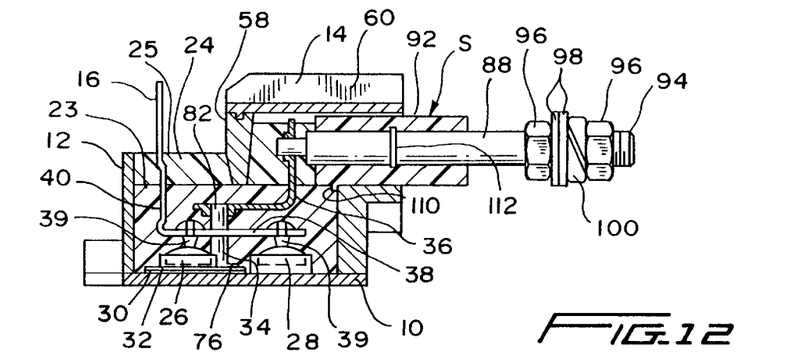
FIG. 12 is a cross-section view taken along line 12—12 of FIG. 11 in conjunction with the cross-section view taken along line 4—4 of FIG. 3.
Figure 13:
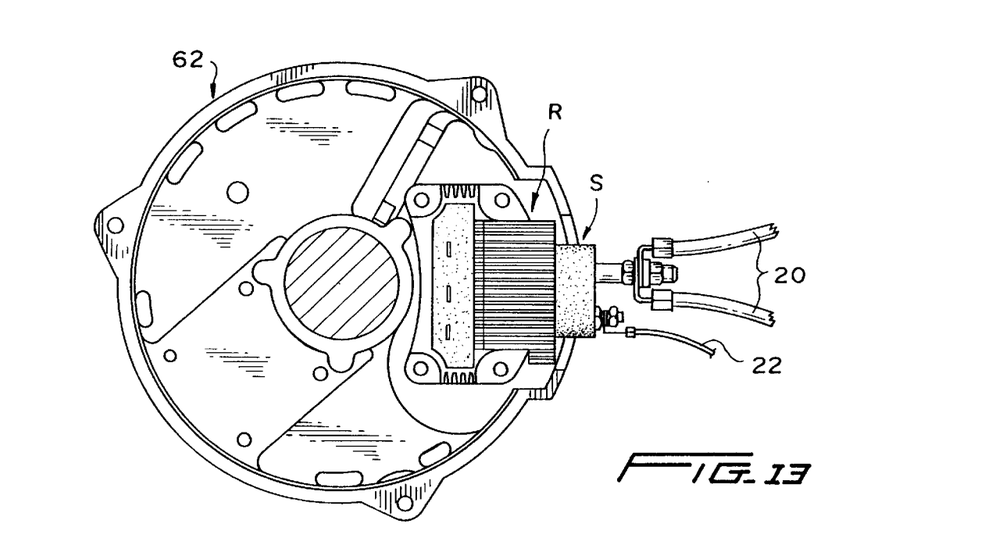
FIG. 13 is a fragmentary end view within an alternator, showing the location of the rectifier of the present invention with the output connector of FIG. 11 as used in the alternator.

Referring to FIGS. 12 and 13, the connector assembly S is shown connected to the rectifier device R. It will be seen that the connector block S provides access to the user for connecting and disconnecting the wires 20 and 22 from the rectifier device R and from the alternator 62 for maintenance or replacement purposes. The connector block S advantageously provides a means for removably connecting the wires 20 and 22 to the rectifier device R and yet without the disadvantage of the prior art plug-in connector, which is susceptible to arcing and overheating.

While this invention has been described as having preferred design, it is understood that it is capable of further modification, uses and/or adaptations of the invention following in general the principle of the invention and including such departures from the present disclosure as come within known or customary practice in the art to which the invention pertains, and as may be applied to the essential features set forth, and fall within the scope of the invention or the limits of the appended claims.

I claim:

1. A rectifier device for an alternator, comprising:
   a) a housing including a base forming a DC output terminal;
   b) an insulating layer disposed on a portion of said base and a conducting layer material disposed on said insulating layer;
   c) a first group of diodes secured and electrically connected to said base;
   d) a second group of diodes secured and electrically connected to said conducting material;
   e) a plurality of input connectors operably connected to said first and second groups of diodes, said input connectors for being operably connected to the alternator;
   f) another DC output terminal including first and second ends, said first end being operably connected within said housing to said second group of diodes, said second end extending outside said housing, said second end for being connected to a load;
   g) a plastic member secured to an intermediate portion of said another DC output terminal;
   h) said housing including a slot; and
   i) said plastic member is disposed within said slot such that said another DC output terminal is spaced from said housing.

2. A rectifier device as in claim 1, wherein:
   a) said first and second groups of diodes and said another DC output terminal first end are encased in plastic material.

3. A rectifier device as in claim 2, wherein:
   a) said plastic material includes epoxy.

4. A rectifier device as in claim 1, wherein:
   a) said housing includes side walls having cooling fins.

5. A rectifier device as in claim 1, and further comprising:
   a) a cap disposed over said another DC output terminal first end, said plastic member and said slot.

6. A rectifier device as in claim 5, wherein:
   a) said cap includes cooling fins.

7. A rectifier device as in claim 1, wherein:
   a) said base is copper.

8. A rectifier device as in claim 4, wherein:
   a) said side walls are aluminum.

9. A rectifier device as in claim 4, and further comprising:
a) a divider wall disposed within said housing such that said housing is divided into first and second portions.

10. A rectifier device as in claim 9, wherein:
a) said plurality of input connectors extend beyond said housing through said first portion.

11. A rectifier device as in claim 9, wherein:
a) said first end of said another DC output terminal is disposed within said second portion.

12. A rectifier device as in claim 9, wherein:
a) said first portion is filled with plastic material to a first level; and
b) said second p ortio n is filled with said plastic material to a second level higher than said first level.

13. A rectifier device for an alternator, comprising:
a) a housing including a base and side walls, said base forming a DC output terminal, said housing including an open top, said housing including a divider wall extending across said open top to define first and second openings, said divider wall having a bottom edge being spaced a distance from said base;
b) first and second groups of diodes disposed within said housing, said groups of diodes being secured to said base and connected together for rectifying an AC voltage to a DC voltage;
c) a plurality of input connectors operably connected to said groups of diodes, said input connectors for being operably connected to the alternator, said input connectors extending through said first opening; and
d) another DC output terminal having first and second ends, said first end being operably connected to one of said first and second groups of diodes and said second end for connecting to a load, said first end being disposed below said second opening.

14. A rectifier device as in claim 13, wherein:
a) said housing is filled with plastic material.

15. A rectifier device as in claim 14, wherein:
a) said plastic material includes epoxy.

16. A rectifier device as in claim 13, wherein:
a) said base is copper.

17. A rectifier device as in claim 13, wherein:
a) said side walls are aluminum.

18. A rectifier device as in claim 13, wherein:
a) said side walls include cooling fins.

19. A rectifier device as in claim 13, wherein:
a) said bottom edge of said divider wall is disposed below an upper edge of said housing thereby to divide an upper portion of said housing into first and second portions.

20. A rectifier device as in claim 19, wherein:
a) said first portion is filled with plastic material to a first level; and
b) said second portion is filled with said plastic material to a second level higher than said first level.

21. A rectifier device as in claim 19, and further comprising:
a) a cover disposed over said second opening.

22. A rectifier device as in claim 21, wherein:
a) said cover includes cooling fins disposed on its outside surface.

23. A rectifier device for an alternator, comprising:
a) a housing including a base and side walls, said base forming a DC output terminal, said housing including an open top, said housing including a divider wall extending across said open top to define first and second openings, one of said side walls including a wall opening communicating with said second opening;
b) a cover disposed over said second opening;
b) first and second groups of diodes disposed within said housing, said groups of diodes being secured to said base and connected together for rectifying an AC voltage to a DC voltage;
c) a plurality of input connectors operably connected to said groups of diodes, said input connectors for being operably connected to the alternator, said input connectors extending through said first opening; and
d) another DC output terminal extending into said housing through said wall opening, said another DC output terminal having first and second ends, said first end being operably connected to one of said first and second groups of diodes and said second end for connecting to a load, said first end being disposed below said cover.

24. A rectifier device as in claim 23, wherein:
a) said walls and said cover includes cooling fins.

25. A rectifier device as in claim 23, wherein:
a) said second end of said another DC output terminal includes a threaded portion and a pair of nuts for being operably secured to the load.

26. A rectifier device as in claim 23, and further comprising:
a) a plastic member molded around an intermediate portion of said another DC output terminal; and
b) said plastic member is disposed in said wall opening and below said cover.

* * * * *